United States Patent [19]
Suganaga et al.

[11] Patent Number: 6,087,693
[45] Date of Patent: Jul. 11, 2000

[54] SEMICONDUCTOR DEVICE WITH REDUCED STEPPED PORTIONS

[75] Inventors: Toshifumi Suganaga; Eiichi Ishikawa, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).
This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/953,504

[22] Filed: Oct. 17, 1997

Related U.S. Application Data

[63] Continuation-in-part of application No. 08/870,233, Jun. 5, 1997, Pat. No. 5,776,825, which is a continuation of application No. 08/632,193, Apr. 15, 1996, abandoned, which is a division of application No. 08/397,341, Mar. 2, 1995, Pat. No. 5,539,231.

[30] Foreign Application Priority Data

Jul. 11, 1994 [JP] Japan .................................. 6-158779

[51] Int. Cl.[7] ....................... H01L 27/108; H01L 27/148

[52] U.S. Cl. ...................... 257/306; 257/249; 257/296; 257/300

[58] Field of Search ..................... 257/306–309, 257/204, 249, 296, 300, 758, 774; 438/618

[56] References Cited

U.S. PATENT DOCUMENTS

| | | | |
|---|---|---|---|
| 5,383,088 | 1/1995 | Chapple-Solo et al. | 257/306 |
| 5,539,231 | 7/1996 | Suganaga et al. | 257/306 |

FOREIGN PATENT DOCUMENTS

| | | |
|---|---|---|
| 1-112769 | 5/1989 | Japan . |
| 4-14862 | 1/1992 | Japan . |
| 5-267642 | 10/1993 | Japan . |

*Primary Examiner*—Minh Loan Tran
*Assistant Examiner*—Hung Kim Vu
*Attorney, Agent, or Firm*—McDermott, Will & Emery

[57] ABSTRACT

A first conductive layer and a second conductive layer are formed apart from each other on a surface of a semiconductor substrate. A first contact hole for exposing a surface of first conductive layer is formed in an interlayer insulating film. A first interconnection layer is buried in first contact hole so as to be in contact with first conductive layer. The position of the surface of first interconnection layer is the same as or lower than the surface of interlayer insulating film. The surface of first interconnection layer is covered with an insulating film. A second contact hole for exposing a surface of second conductive layer is provided in interlayer insulating film. A second conductive layer is connected to second conductive layer through second contact hole.

6 Claims, 22 Drawing Sheets

SEMICONDUCTOR DEVICE WITH REDUCED STEPPED PORTIONS

RELATED APPLICATIONS

This application is a continuation in part of application Ser. No. 08/870,233 filed Jun. 5, 1997, now U.S. Pat. No. 5,776,825, which is a continuation of application Ser. No. 08/632,193 filed Apr. 15, 1996, abandon which is a division of application Ser. No. 08/397,341 filed Mar. 2, 1995, now U.S. Pat. No. 5,539,231 issued Jul. 23, 1996.

BACKGROUND OF THE INVENTION

1. Field of the Invention

The present invention relates generally to semiconductor devices, and more particularly, to an improved semiconductor device permitting stepped portions of the device to be reduced. The present invention also relates to an improved semiconductor device permitting improvement of registration precision.

2. Description of the Background Art

In a semiconductor device with a multi-layer interconnection structure, the interconnection layers are formed on different insulating layers. These interconnections are connected to conductive layers formed on the semiconductor substrate through contact holes provided in the insulating layers.

FIG. 15 is a plan view showing an example of such a semiconductor device with a multi-layer interconnection structure, a conventional dynamic random access memory. FIG. 16 is a cross sectional view taken along line 16—16 in FIG. 15.

Referring to these figures, the dynamic random access memory (DRAM) includes a semiconductor substrate 13. A field oxide film 12 for electrically isolating an active region 11 from the other active regions is provided in a main surface of semiconductor substrate 13. A gate electrode 1 is provided on semiconductor substrate 13 with a gate insulating film 14 therebetween. A pair of source/drain layers 15a, 15b are provided in the main surface of semiconductor substrate 13 on both sides of gate electrode 1. A first interlayer insulating film 2 is provided on semiconductor substrate 13, covering gate electrode 1. A first contact hole 10 for exposing a surface of one source/drain layer 15a is provided in first interlayer insulating film 2. A buried bit interconnection layer 4 is provided on first interlayer insulating film 2 so as to be electrically connected to one source/drain layer 15a through first contact hole 10. The upper part of buried bit interconnection layer 4 extends horizontally on the surface of first interlayer insulating film 2. A second interlayer insulating film 51 is provided on first interlayer insulating film 2, covering buried bit interconnection layer 4. A second contact hole 9 for exposing a surface of the other source/drain layer 15b is provided, penetrating through first interlayer insulating film 2 and second interlayer insulating film 51. A storage node interconnection 6 is provided on second interlayer insulating film 51 so as to be connected to the other source/drain layer 15b through second contact hole 9. A capacitor insulating film 16 covers a surface of storage node interconnection 6. A cell plate electrode 17 covers the surface of storage node interconnection 6 with capacitor insulating film 16 therebetween.

A method of manufacturing the DRAM shown in FIG. 16 will now be described.

Referring to FIG. 17, field oxide film 12 for isolating active region 11 from the other active regions is formed in the main surface of semiconductor substrate 13. Gate electrode 1 is formed on semiconductor substrate 13 with gate insulating film 14 therebetween. Pair of source/drain layers 15a, 15b are formed in the main surface of semiconductor substrate 13 on both sides of gate electrode 1 by means of implanting an impurity. First interlayer insulating film 2 is formed on semiconductor substrate 13 so as to cover gate electrode 1.

Referring to FIG. 18, photoresist 3 is formed on first interlayer insulating film 2. Photoresist 3 is patterned such that an opening 3a can be formed above one source/drain layer 15a.

Referring to FIGS. 18 and 19, first interlayer insulating film 2 is etched using photoresist 3 as mask, and first contact hole 10 for exposing a surface of one source/drain layer 15a is in first interlayer insulating film 2. Photoresist 3 is removed.

Referring to FIG. 20, a conductive layer 18 to form a buried bit interconnection to be electrically connected to one source/drain layer 15a through first contact hole 10 is formed. Photoresist 19 having a shape corresponding to the shape of the buried bit interconnection is formed on conductive layer 18.

Referring to FIGS. 20 and 21, conductive layer 18 is patterned using photoresist 19 as mask, and buried bit interconnection layer 4 is formed. Photoresist 19 is removed. Referring to FIG. 22, second interlayer insulating film 51 is formed on first interlayer insulating film 2, covering buried bit interconnection layer 4. Positive photoresist 20 is formed on second interlayer insulating film 51. A photomask 21 is placed on photoresist 20. Photomask 21 has a portion 21a for passing light toward the other source/drain layer 15b. Using photomask 21, light 22 is selectively directed to photoresist 20. Referring to FIG. 23, the part of resist 20 exposed with light is removed away by means of development.

Referring to FIGS. 23 and 24, using photoresist 20 as mask, second interlayer insulating film 51 and first interlayer insulating film 2 are etched, and second contact hole 9 for exposing a surface of the other source/drain layer 15b is formed. Photoresist 20 is then removed away.

Referring to FIG. 25, storage node interconnection 6 is formed on second interlayer insulating film 51 so as to be connected to the other source/drain layer 15b through second contact hole 9. A surface of storage node interconnection 6 is covered with capacitor insulating film 16. Covering storage node interconnection 6 with cell plate electrode 17 with capacitor insulating film 16 therebetween completes the conventional DRAM.

Thus manufactured conventional semiconductor devices with multi-layer interconnection structure are encountered with the following disadvantages.

More specifically, referring to FIGS. 22 and 26 in comparison, there will be a problem if misregistration of photomask 21 occurs when forming a second contact hole.

Misregistration of photomask 21 forms an opening shifted in photoresist 20. Etching first interlayer insulating film 2 and second interlayer insulating film 51 to form second contact hole 9 in this state exposes part of the surface of gate electrode 1 and part of the surface of buried bit interconnection layer 4 and partially removes field oxide film 12. Referring to FIGS. 27 and 28, if second contact hole 9 is formed shifted from the position as designed, and storage node interconnection 6 is connected to the other source/drain layer 15b, storage node interconnection 6 may be electrically connected to gate electrode 1 and buried bit interconnection layer 4 as well, or field oxide film 12 is partially removed, resulting in current leakage. The reliability of the DRAM thus decreases. The above-described method therefore strictly requires high registration precision.

Referring to FIG. 16, since buried bit interconnection layer 4 extends on first interlayer insulating film 2, stepped portions are generated, which makes difficult subsequent patterning of interconnections.

SUMMARY OF THE INVENTION

It is therefore an object of the invention to provide an improved semiconductor device permitting reduction of the thicknesses of interlayer insulating films and therefore reduction of stepped portions in the device.

Another object of the invention is to provide an improved dynamic random access memory permitting reduction of the thicknesses of interlayer insulating films and therefore reduction of stepped portions in the device.

Yet another object of the invention is to provide a method of manufacturing an improved semiconductor device permitting improvement of registration precision.

A still further object of the invention is to provide a method of manufacturing an improved semiconductor device permitting increase of margin in micro lithography.

An additional object of the invention is to provide a method of manufacturing an improved dynamic random access memory permitting improvement of registration precision.

A semiconductor device according to a first aspect of the present invention includes a semiconductor substrate. A first conductive layer and a second conductive layer are formed apart from each other on a surface of the semiconductor substrate. An interlayer insulating film is formed on the semiconductor substrate. A first contact hole for exposing a surface of the first conductive layer is provided in the interlayer insulating film. A first interconnection layer is buried in contact with the first conductive layer in the first contact hole. The position of the surface of the first interconnection layer is the same as the surface of the interlayer insulating film or lower. An insulating film covers the first interconnection layer. A second contact hole for exposing a surface of the second conductive layer is provided in the interlayer insulating film. A second interconnection layer is provided on the interlayer insulating film so as to be in contact with the second conductive layer through the second contact hole.

A semiconductor device according to a second aspect of the present invention includes a semiconductor substrate. A gate electrode is provided on the semiconductor substrate. A pair of source/drain layers are provided in a surface of the semiconductor substrate on both sides of the gate electrode. An interlayer insulating film is provided on the semiconductor substrate, covering the gate electrode. A first contact hole for exposing a surface of one of the source/drain layers is provided in the interlayer insulating film. A buried bit interconnection layer is buried in the first contact hole to be electrically connected to the one source/drain layer. The position of the surface of the buried bit line interconnection layer is the same as the position of the surface of the interlayer insulating film or lower. An insulating film covers the surface of the buried bit interconnection layer. A second contact hole for exposing a surface of the other source/drain layer is provided in the interlayer insulating film. A storage node interconnection is provided on the interlayer insulating film to be connected to the other source/drain layer. A capacitor insulating film covers a surface of the storage node electrode. A cell plate electrode covers the storage node interconnection with the capacitor insulating film therebetween.

In a method of manufacturing a semiconductor device according to a third aspect of the invention, a first conductive layer and a second conductive layer are formed apart from each other on a surface of a semiconductor substrate. An interlayer insulating film is formed on the semiconductor substrate. A first contact hole for exposing a surface of the first conductive layer and a second contact hole for exposing a surface of the second conductive layer are simultaneously formed in the interlayer insulating film. An insulator with a higher etching rate than the interlayer insulating film fills the first and second contact holes. The second contact hole is covered with resist, and the insulator filling the first contact hole is etched away. The resist is removed. A first interconnection layer to be connected to the first conductive layer through the first contact hole is formed on the semiconductor substrate. The first interconnection layer is etched back until the position of the surface is the same as the surface of the interlayer insulating film or lower, and a buried first interconnection layer buried in the first contact hole is thus formed. The surface of the buried first interconnection layer is covered with an insulating film. The insulator filling the second contact hole is removed. A second interconnection layer to be connected to the second conductive layer through the second contact hole is formed on the interlayer insulating film.

In the semiconductor device according to the first aspect of the invention, the position of the surface of the first interconnection layer is the same as the surface of the interlayer insulating film or lower, and therefore stepped portions in the device are reduced.

In the semiconductor device according to the second aspect of the invention, the position of the surface of the buried bit interconnection layer is the same as the position of the surface of the interlayer insulating film or lower, stepped portions in the dynamic random access memory can be reduced.

In the method of manufacturing the semiconductor device according to the third aspect of the invention, the first contact hole for exposing the surface of the first conductive layer and the second contact hole for exposing the surface of the second conductive layer are formed in the interlayer insulating film at a time, and therefore the positions of the first contact hole and the second contact hole will not be shifted from their originally designed positions.

The foregoing and other objects, features, aspects and advantages of the present invention will become ore apparent from the following detailed description of the present invention when taken in conjunction with the accompanying-drawings.

DESCRIPTION OF THE PREFERRED EMBODIMENTS

Embodiments of the present invention will be now described.

Embodiment 1

Figure 1:
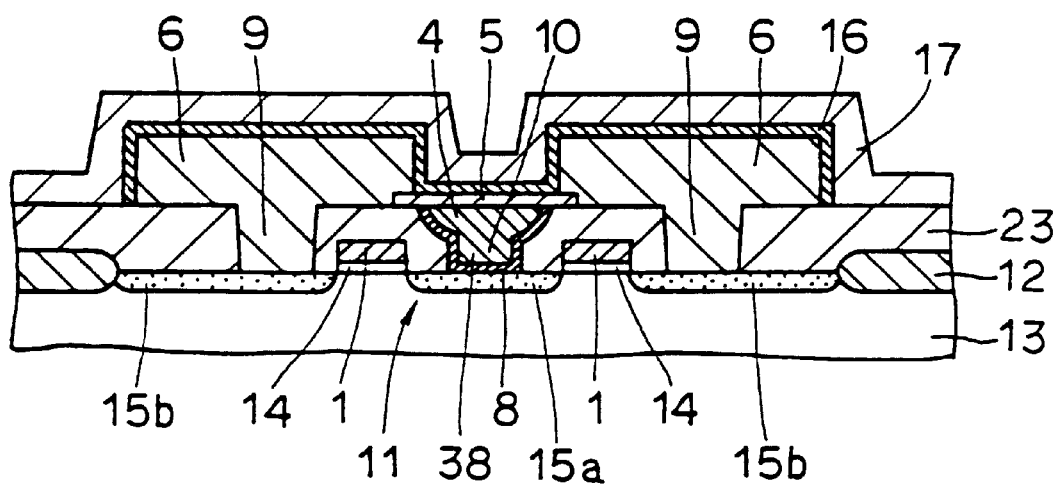
FIG. 1 is a cross sectional view showing a DRAM according to Embodiment 1.

FIG. 1 is a cross sectional view showing a DRAM according to Embodiment 1. Referring to FIG. 1, the DRAM according to Embodiment 1 includes a semiconductor substrate 13. A field oxide film 12 for isolating an active region 11 from the other active regions is provided in a surface of semiconductor substrate 13. A gate electrode 1 is formed on semiconductor substrate 13 with a gate insulating film 14 therebetween. Conductive layers, a pair of source/drain layers 15a, 15b are provided in the surface of semiconductor substrate 13 on both sides of gate electrode 1. An interlayer insulating film 23 is provided on semiconductor substrate 13, covering gate electrode 1. A contact hole 10 for exposing a surface of one source/drain layer 15a is provided in interlayer insulating film 23. A buried bit interconnection layer 4 is buried in first contact hole 10 to be in contact with one source/drain layer 15a. The position of the surface of buried bit interconnection layer 4 is the same as the surface of interlayer insulating film 23. The position of the surface of buried bit interconnection layer 4 may be lower than the surface of interlayer insulating film 23.

Buried bit interconnection layer 4 is formed of a TiN film 8 provided to cover the sidewall surface and bottom surface of first contact hole 10, and a polysilicon film or tungsten silicide film 38 provided on TiN film 8.

Buried bit interconnection layer 4 has a surface covered with an insulating film 5. The thickness of insulating film 5 is at least 0.05 $\mu$m. For a thickness of 0.05 $\mu$m or smaller, sufficient electrical isolation cannot be achieved. A second contact hole 9 for exposing a surface of the other source/drain layer 15b is provided in interlayer insulating film 23. A storage node interconnection 6 is provided on interlayer insulating film 23 so as to be connected to the other source/drain layer 15b through second contact hole 9. A capacitor insulating film 16 covers a surface of storage node interconnection 6. A cell plate electrode 17 is provided on semiconductor substrate 13, covering storage node interconnection 6 with capacitor insulating film 16 therebetween.

In the DRAM according to Embodiment 1, since the position of the surface of buried bit interconnection layer 4 is the same as or lower than the position of the surface of interlayer insulating film 23, stepped portions in the device are reduced.

A method of manufacturing the DRAM shown in FIG. 1 will be now described.

Figure 2:
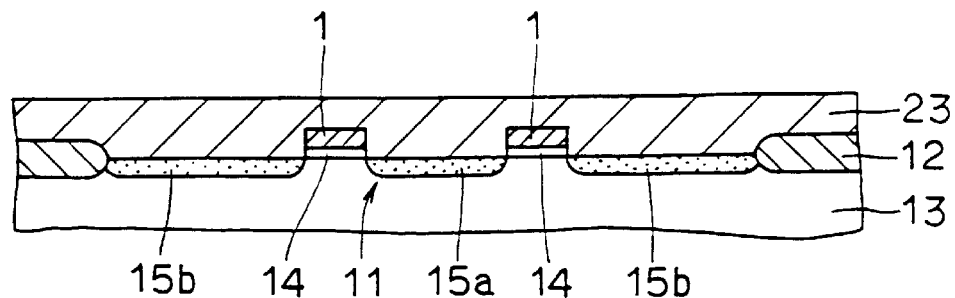
FIGS. 2 to 13 are, cross sectional views showing first to twelfth steps in the order of a method of manufacturing the DRAM according to Embodiment 1.

Referring to FIG. 2, field oxide film 12 for isolating active region 11 from the other active regions is formed on the surface of semiconductor substrate 13. Gate electrode 1 is formed on semiconductor substrate 13 with gate insulating film 14 therebetween. Pair of source/drain layers 15a, 15b are formed in the surface of semiconductor substrate 13 on both sides of gate electrode 1. Interlayer insulating film 23 is formed on semiconductor substrate 13, covering gate electrode 1.

Figure 3:
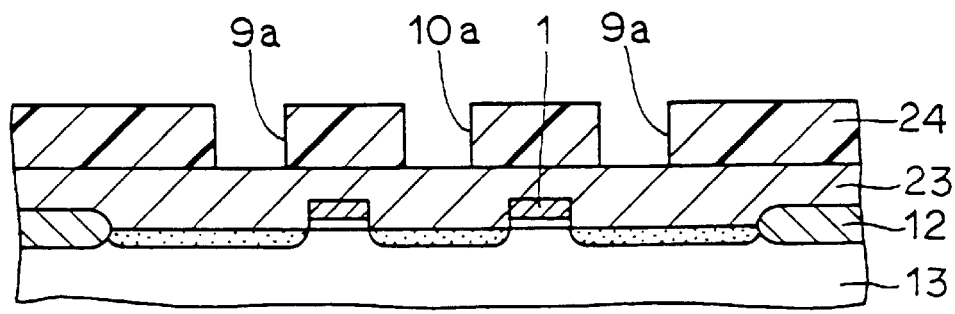

Referring to FIG. 3, photoresist 24 is formed on interlayer insulating film 23. Openings 9a, 10a are formed in photoresist 24 above one source/drain layer 15a and above the other source/drain layer 15a and above the other source/drain layer 15b.

Figure 4:
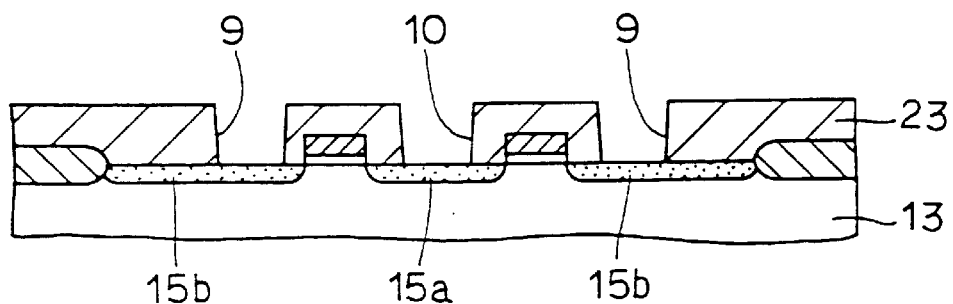

Referring to FIGS. 3 and 4, using photoresist 24 as mask, interlayer insulating film 23 is etched, in order to form at a time first contact hole 10 for exposing a surface of one source/drain layer 15a and second contact hole 9 for exposing a surface of the other source/drain layer 15b. Resist 24 is then removed away.

Figure 5:
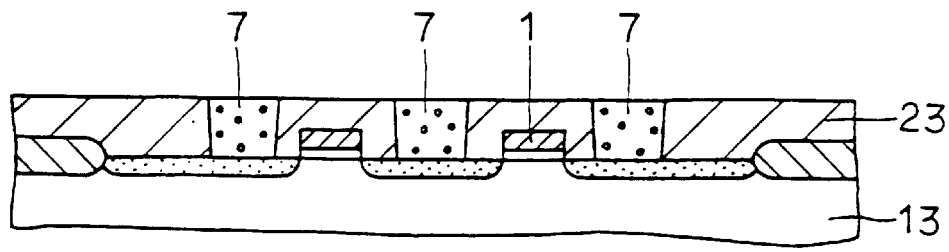

Referring to FIG. 5, an insulating film with a higher etching rate than interlayer insulating film 23 such as a spin-coatable coating oxide film (spin on glass etc.) 7 is formed on semiconductor substrate 13 to fill first contact hole 10 and second contact hole 9. Then, insulating film 7 is etched back until the position of the surface of insulating film 7 is lower than the position of the surface of interlayer insulating film 23.

Figure 6:
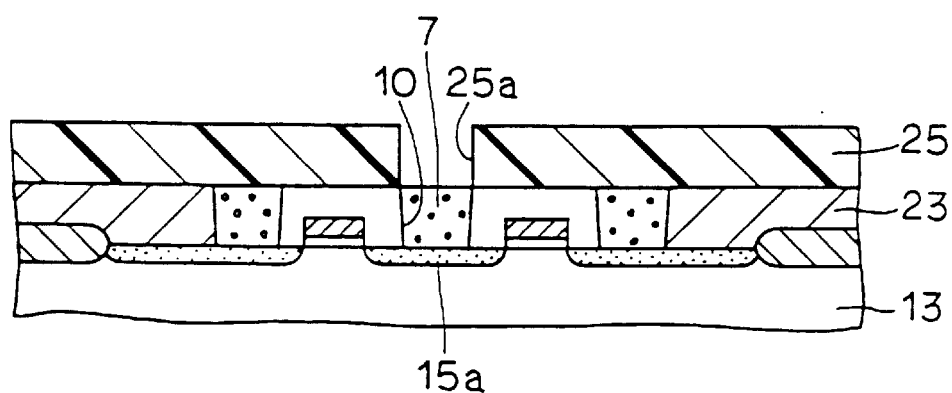

Referring to FIG. 6, photoresist 25 is formed on interlayer insulating film 23. The portion of photoresist 25 above first contact hole 10 is patterned to form opening 25a.

Figure 7:
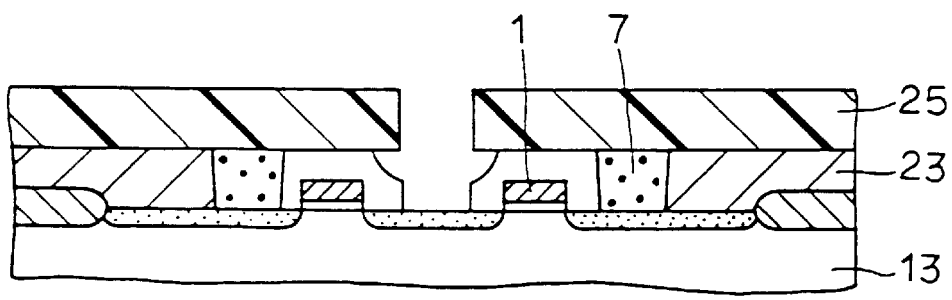

Referring to FIGS. 6 and 7, using photoresist 25 as mask, insulating film 7 is etched away by means of anisotropic or isotropic etching or both.

Figure 8:
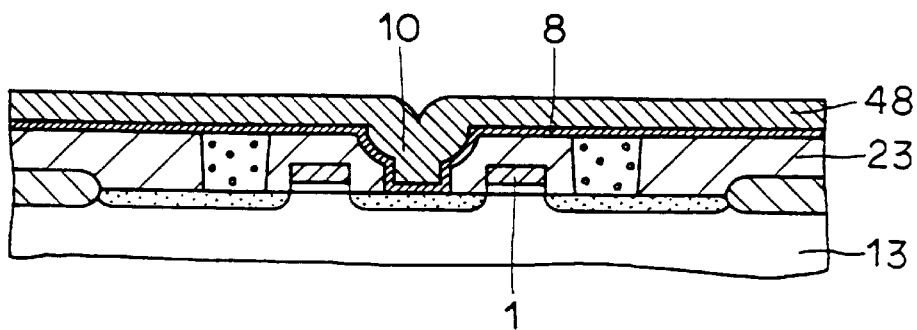

Referring to FIG. 8, TiN is sputtered by means of collimation sputtering to form TiN film 8 on interlayer insulating film 23 so as to cover the sidewall surface and bottom surface of first contact hole 10. Then, a polysilicon film or tungsten silicide film 48 is formed on TiN film 8 by means of chemical vapor deposition so as to fill first contact hole 10.

Figure 9:
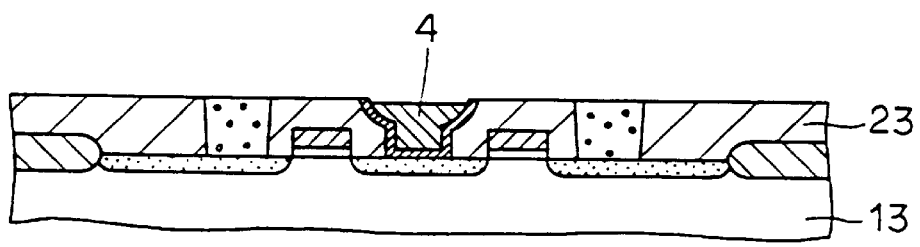

Referring to FIGS. 8 and 9, polysilicon film or tungsten silicide film 48 and TiN film 8 are etched back or polished by means of chemical/mechanical polishing method, and a buried bit interconnection layer 4 buried in first contact hole 10 is formed. The etching back or polishing by CMP or the like is conducted under such a condition that the position of the surface of buried bit interconnection layer 4 is the same as the surface of interlayer insulating film 23 or lower.

Figure 10:
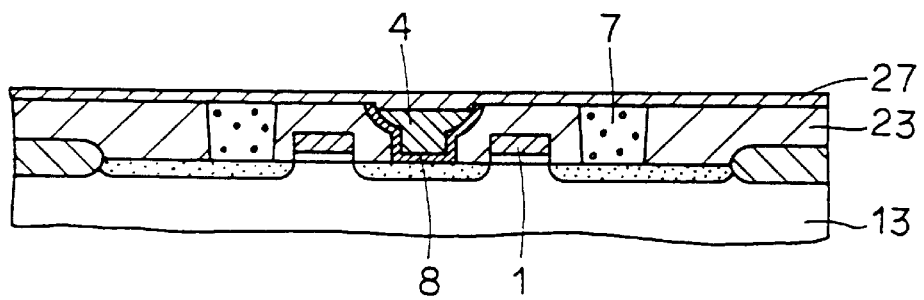

Referring to FIG. 10, a second insulating film 27 is formed on the semiconductor substrate so as to be in contact with the surface of buried interconnection layer 4.

Figure 11:
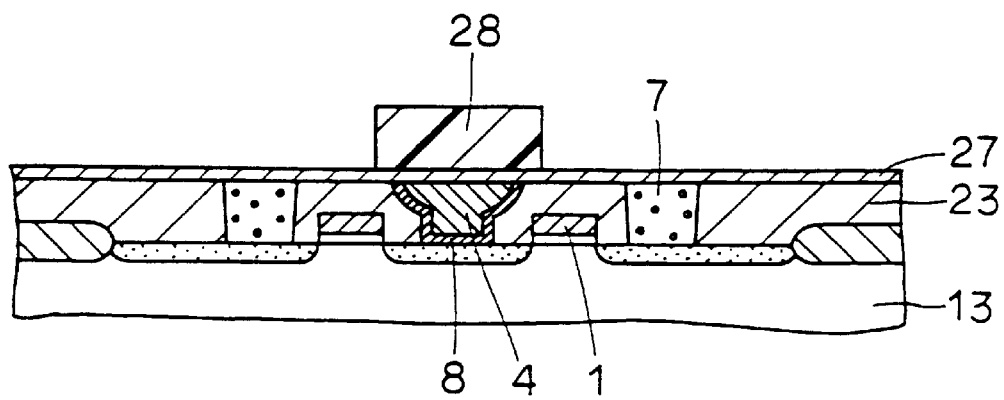
Figure 12:
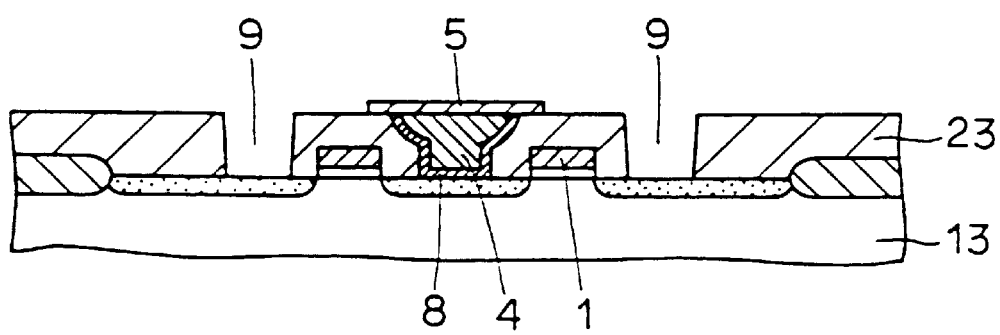

Referring to FIG. 11, resist 28 is formed on second insulating film 27 only above buried bit interconnection layer 4. Referring to FIGS. 11 and 12, second insulating film 27 is patterned using resist 28 as mask, and insulating film 7 is removed. The etching rate of insulating film 7 is higher than that of interlayer insulating film 23, and therefore interlayer insulating film 23 is not etched at the time. Removal of insulating film 7 exposes a surface of the other source/drain region 15b.

Figure 13:
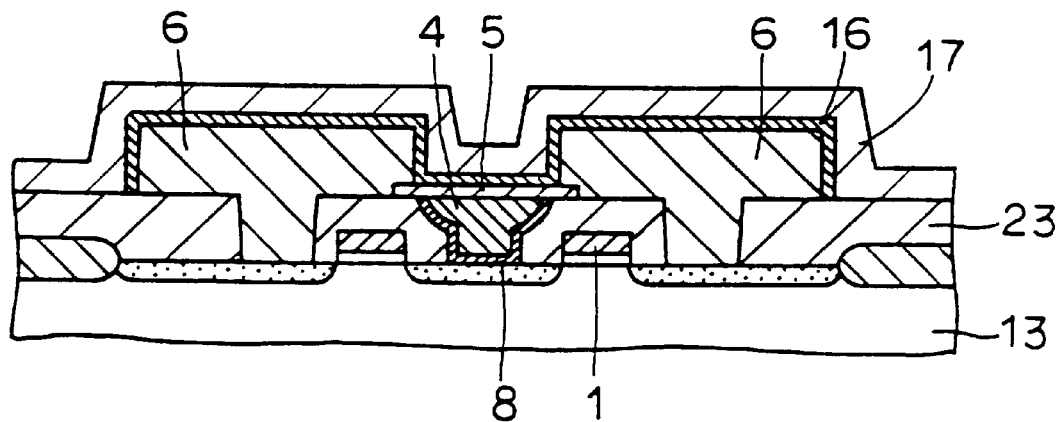

Referring to FIG. 13, a polysilicon film is formed on semiconductor substrate 13 so as to fill second contact hole 9, and the polysilicon film is patterned to form storage node interconnection 6. Then, the surface of storage node interconnection 6 is covered with capacitor insulating film 16. Forming cell plate electrode 17 over storage node interconnection 6 with capacitor insulating film 16 therebetween complete the DRAM.

In this embodiment, referring to FIGS. 3 and 4, opening 10a for forming a first contact hole 10 and opening 9a for forming second contact hole are formed in resist film 24 at a time, and therefore the first contact hole and the second contact hole will not be shifted from their originally designed positions. One step of registering a photomask on resist is reduced, and the precision of total registration is improved as compared to conventional methods. As a result, margin in micro lithography is increased. Referring to FIG. 4, since first contact hole 10 and second contact hole 9 are formed at a time, a single interlayer insulating film needs only be formed. Accordingly, the thickness of total interlayer insulating films can be reduced than conventional cases, and thus stepped portions in the device can be reduced.

Embodiment 2

Figure 14:
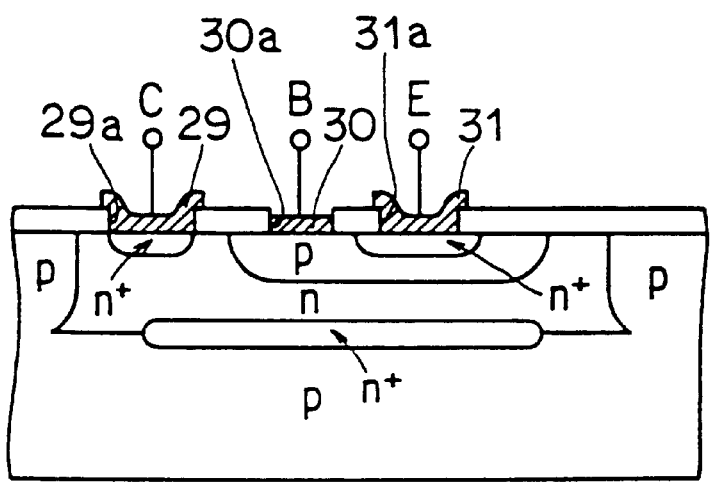
FIG. 14 is a cross sectional view showing a semiconductor device according to Embodiment 2.
Figure 15:
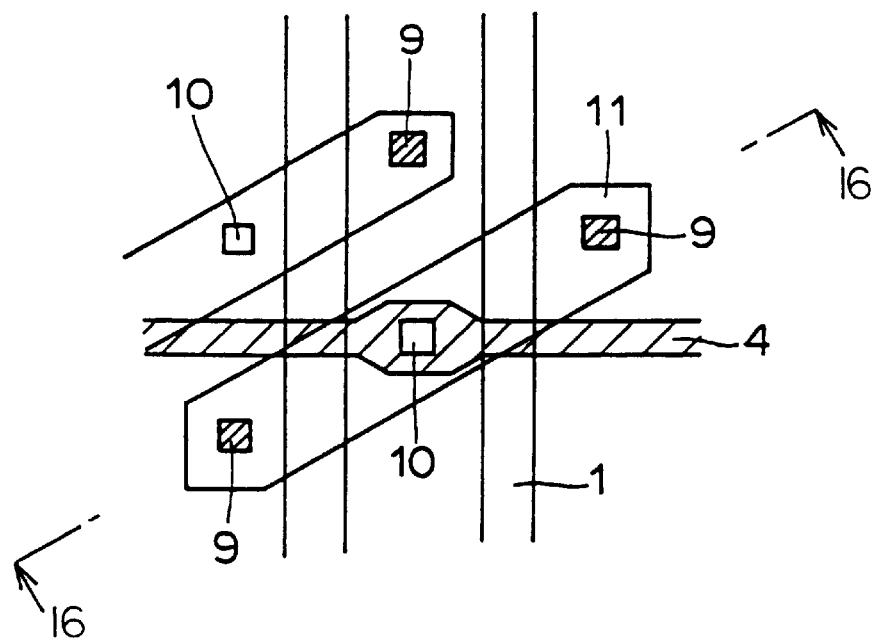
FIG. 15 is a plan view showing a conventional DRAM.
Figure 16:
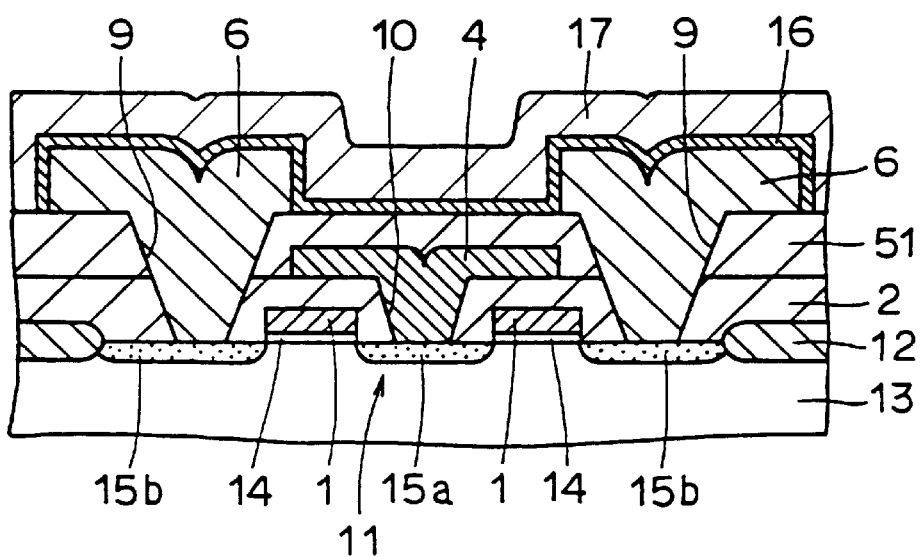
FIG. 16 is a cross sectional view taken along line 16—16 in FIG. 15.
Figure 17:
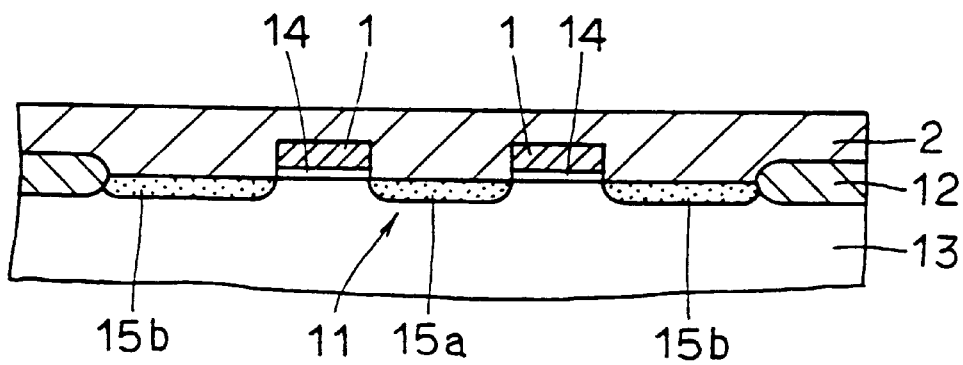
FIGS. 17 to 24 are cross sectional views showing first to eighth steps in the order of a method of manufacturing a conventional DRAM.
Figure 18:
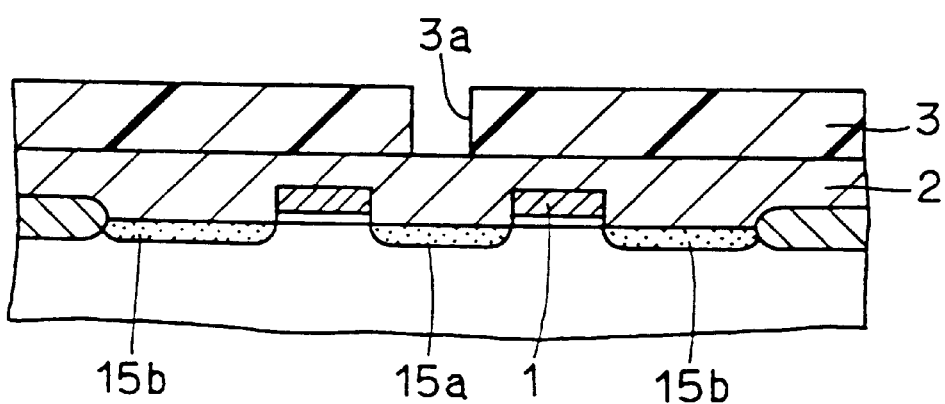
Figure 19:
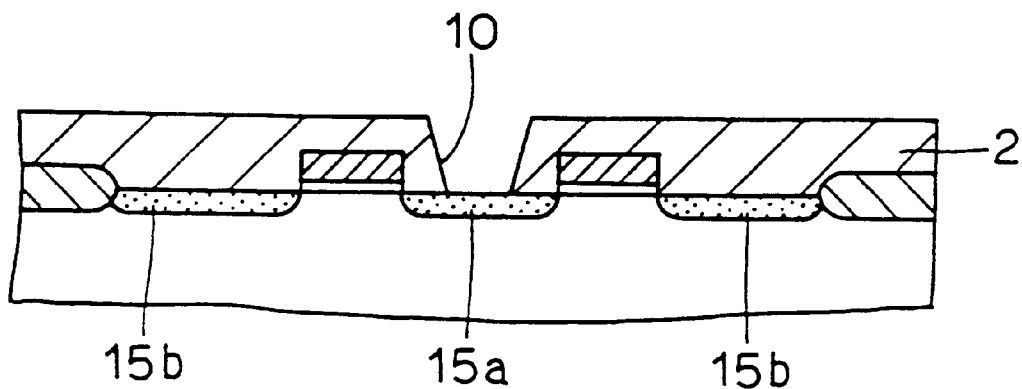
Figure 20:
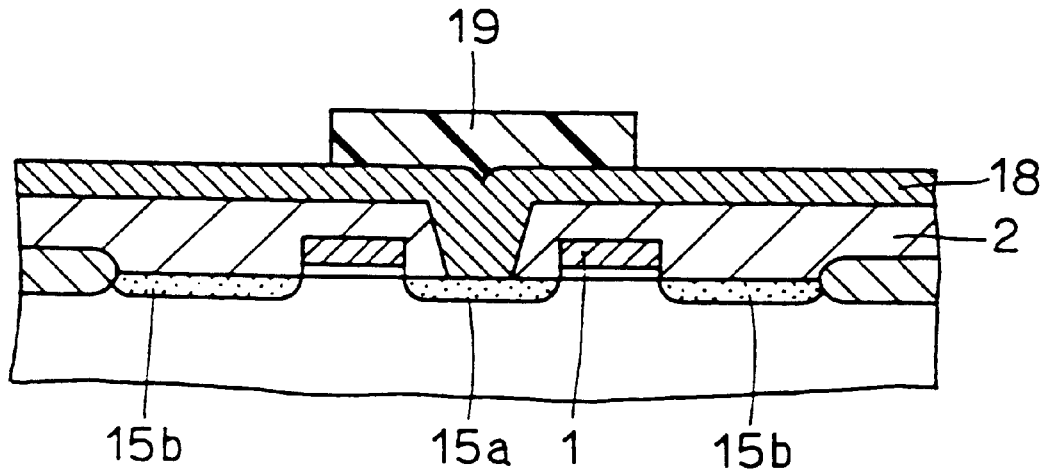
Figure 21:
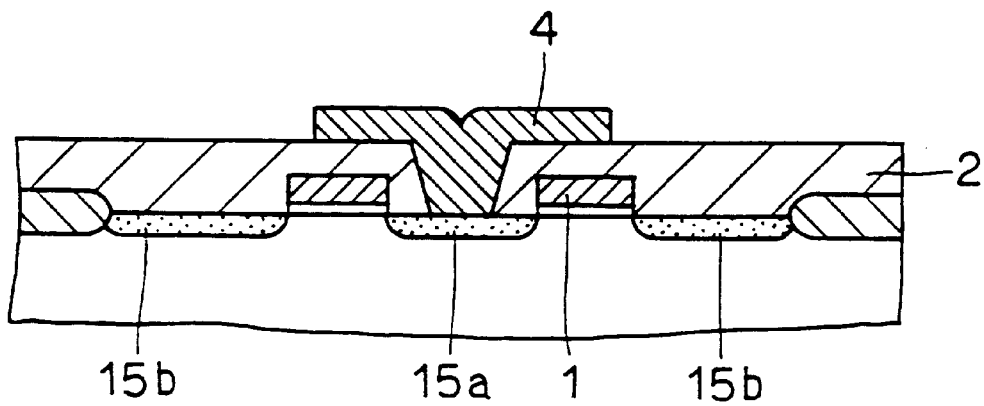
Figure 22:
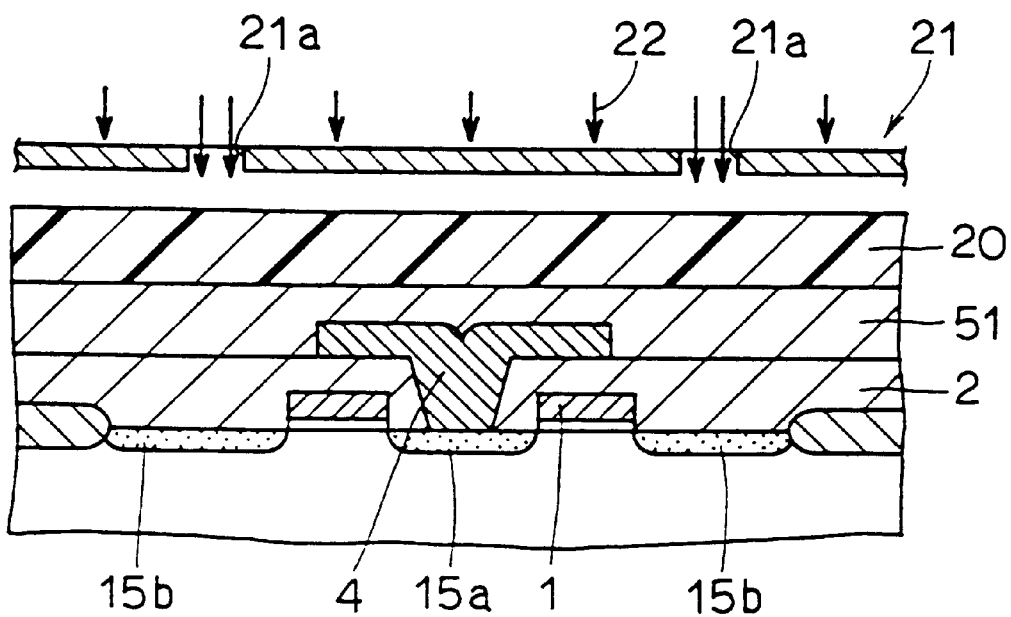
Figure 23:
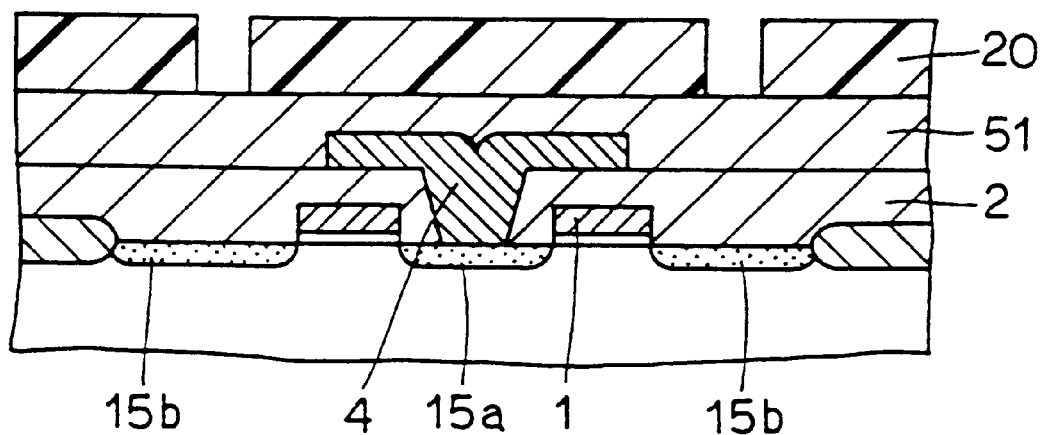
Figure 24:
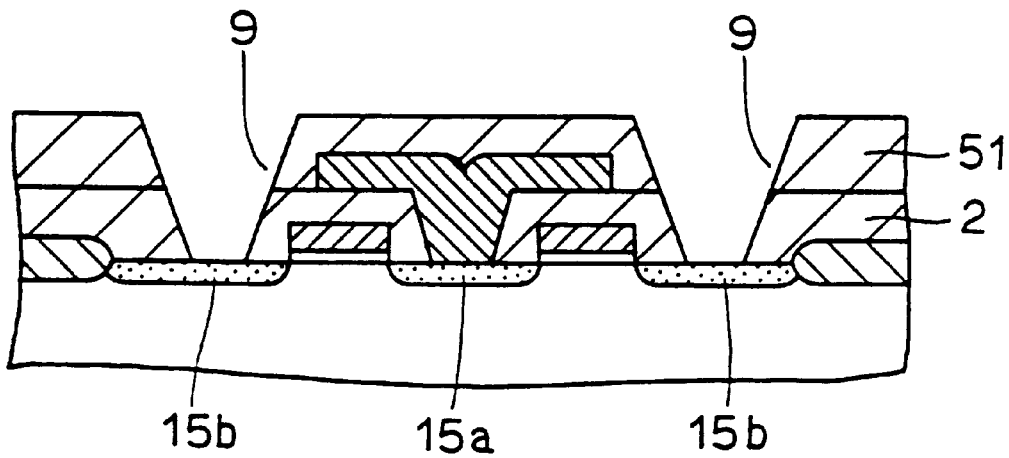
Figure 25:
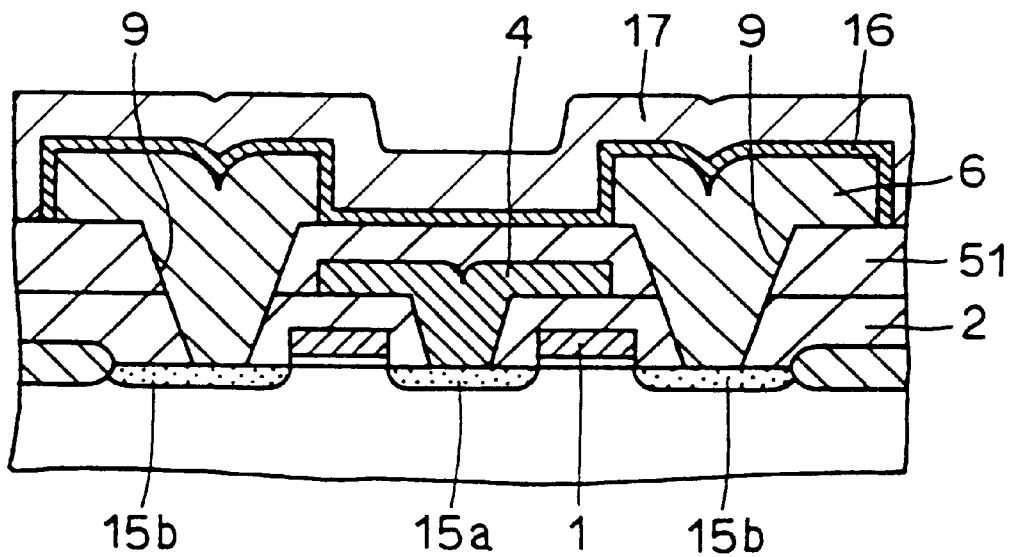
FIG. 25 is a first view for use in illustrating a problem associated with a method of manufacturing a conventional DRAM.
Figure 26:
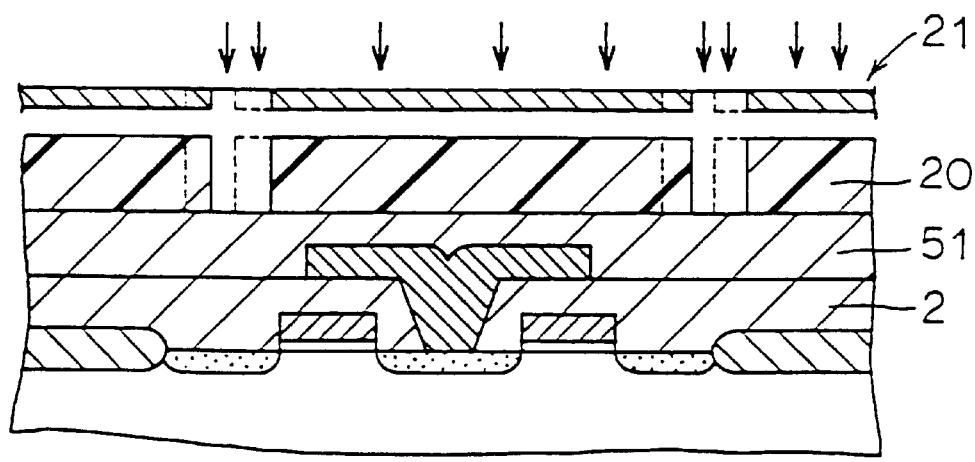
FIG. 26 is second view for use in illustrating a problem associated with the method of manufacturing the conventional DRAM.
Figure 27:
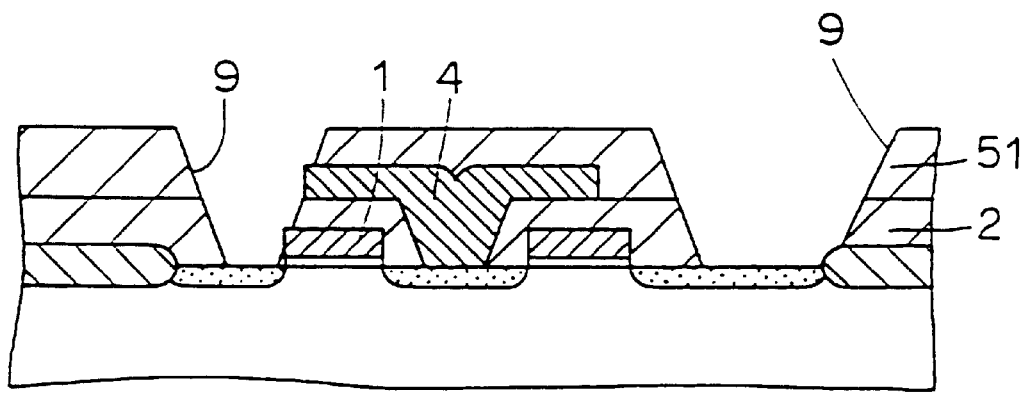
FIG. 27 is a third view for use in illustrating a problem associated with the method of manufacturing the conventional DRAM.
Figure 28:
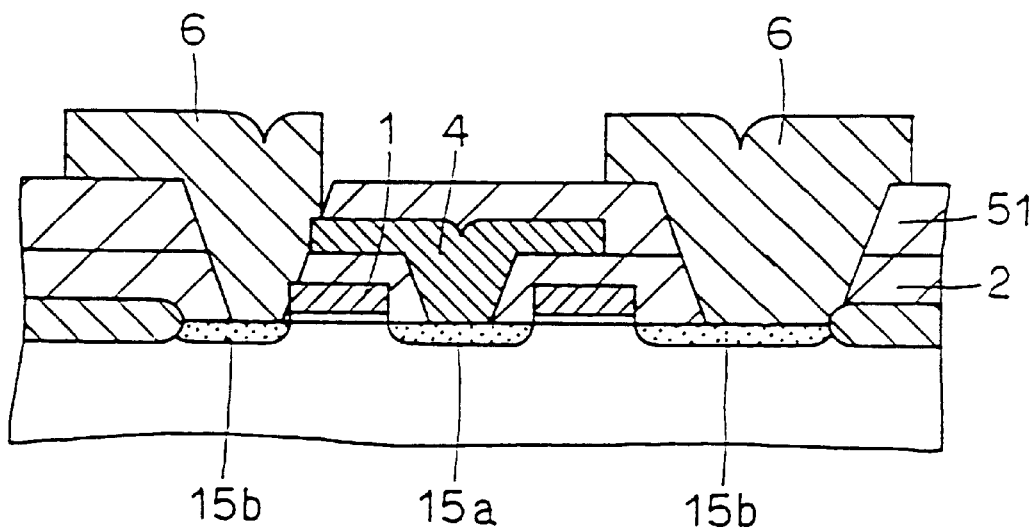
FIG. 28 is a view showing the structure in FIG. 27 with interconnection layers.

In Embodiment 1, the DRAM is described by way of example, but the invention is not limited to such a device, and is applicable to a bipolar transistor as illustrated in FIG. 14.

Referring to FIGS. 1 and 14 in comparison, one storage node interconnection 6 corresponds to a collector electrode, buried bit interconnection layer 4 corresponds to a base electrode 30, and the other storage node interconnection 6 to an emitter electrode 31. Application of the present invention to such a bipolar transistor can reduce the thickness of the interlayer insulating film and therefore stepped portions in the device.

The bipolar transistor as illustrated in FIG. 14 can be formed according to the method shown in FIGS. 2 and 13. As a result, since a contact hole 29a for forming collector electrode 29, and a contact hole 31a for forming emitter electrode 31 are formed at a time, the total registration precision can be improved as compared to conventional methods.

As in the foregoing, in the semiconductor device according to the first aspect of the invention, the position of the surface of the first interconnection layer is the same as or lower than the surface of the interlayer insulating film, and therefore stepped portions in the device can be reduced.

In the semiconductor device according to the second aspect of the invention, the position of the surface of the buried bit interconnection layer is the same as or lower than the surface of the interlayer insulating film, and therefore a DRAM with reduced stepped portions is provided.

By the method of manufacturing the semiconductor device according to the third aspect of the invention, the first contact hole for exposing the surface of the first conductive layer and the second contact hole for exposing the surface of the second conductive layer are formed at a time, and therefore the positions of first contact hole and second contact hole will not be shifted. In addition, one step of registering photomask on resist is reduced, and therefore the total registration precision can be improved as compared to the conventional methods. As a result, margin in micro lithography can be increased.

Embodiment 3

Figure 29:
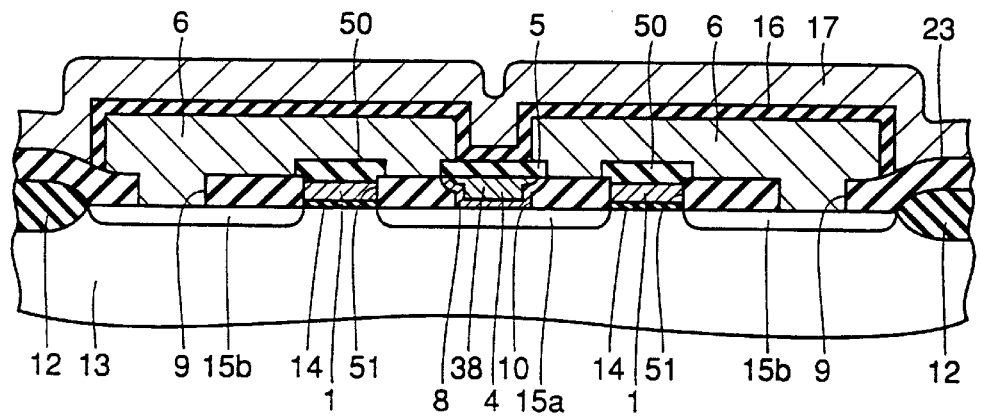
FIG. 29 is a cross sectional view showing a DRAM according to Embodiment 3.
Figure 30:
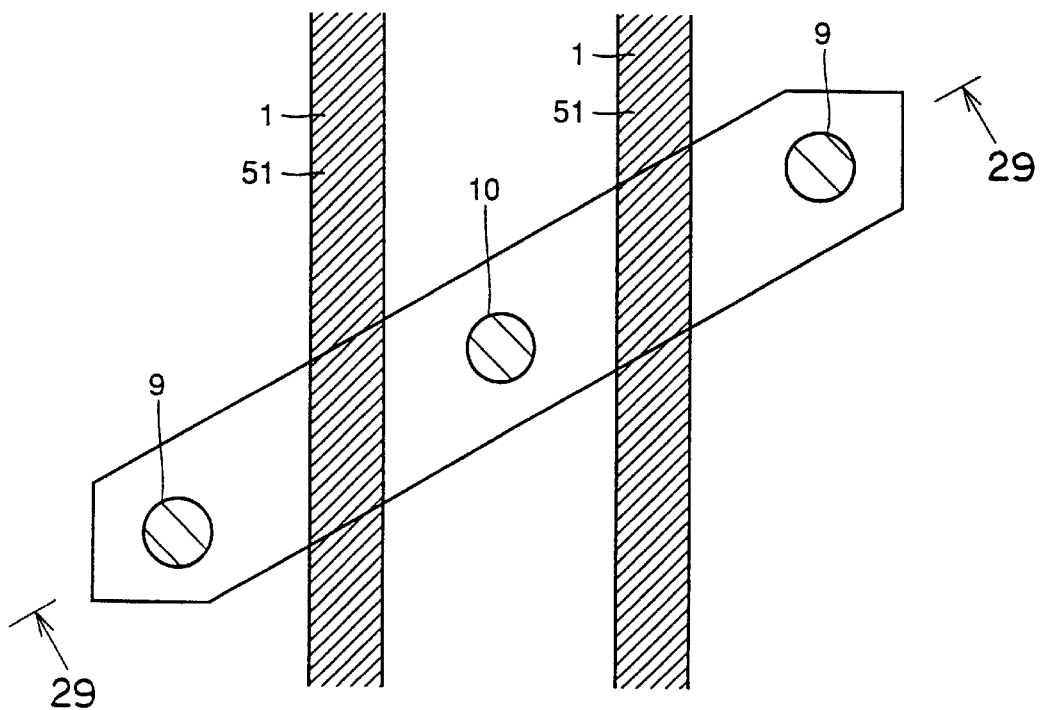
FIG. 30 is a plan view showing DRAM according to Embodiment 3.

FIG. 29 is a cross sectional view showing a semiconductor memory device according to Embodiment 3. FIG. 30 is a plan view showing the semiconductor memory device according to Embodiment 3. FIG. 29 is a cross sectional view taken along line 29—29 in FIG. 30.

The semiconductor memory device includes a semiconductor substrate 13 having a main surface. There is provided an interlayer insulating film 23 on semiconductor substrate 13. An interconnection groove 51 to bury a gate interconnection layer 1 is provided in interlayer insulating film 23. A pair of source/drain layers 15a and 15b are formed in the main surface of semiconductor substrate 13 and on both sides of interconnection groove 51. There are provided in interlayer insulating film 23 a first contact hole 10 to expose one of the source/drain layers, 15a and a second contact hole 9 to expose the other of the source/drain layers, 15b. A gate oxide film 14 is provided on the bottom of interconnection groove 51. A gate interconnection layer 1 having its surface level set almost as high as the surface of interlayer insulating film 23 is buried in interconnection groove 51. A bit interconnection layer 4 having its surface level set almost as high as the surface of interlayer insulating film 23 is buried in first contact hole 10. Bit interconnection layer 4 is formed of a TiN film 8 to cover the sidewall surface and bottom surface of first contact hole 10, and a polysilicon film or a tungsten silicide film 38 provided on TiN film 8.

Insulating film 50 covers gate interconnection layer 1. Insulating film 5 covers bit interconnection layer 4. There is provided a storage node interconnection 6 on interlayer insulating film 23 to be connected to the other 15b of source/drain layers through second contact hole 9. A capacitor insulating film 16 covers the surface of storage node interconnection 6. There is provided a cell plate electrode 17 on semiconductor substrate 13 to cover storage node interconnection 6 with a capacitor insulating film 16 therebetween.

The thickness of each of first and second insulating films 5 and 50 is preferably not less than 0.05 $\mu$m. If insulating films 5 and 50 have a thickness less than 0.05 $\mu$m, their insulative capability lowered.

A method of manufacturing the semiconductor memory device according to Embodiment 3 will be now described.

Figure 31:
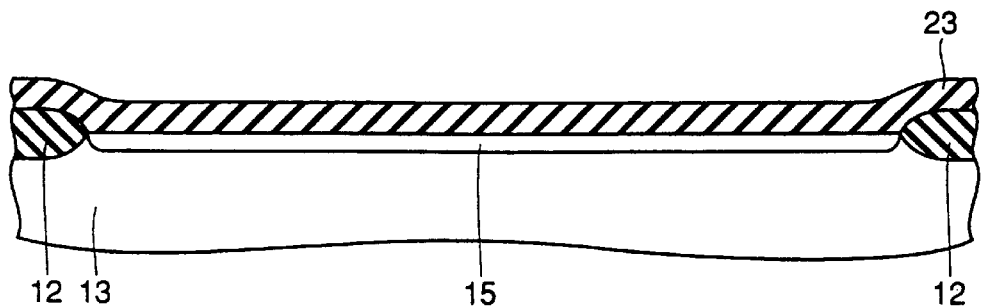
FIGS. 31 to 49 are cross sectional views showing a semiconductor device in steps in the procedure of a method of manufacturing the DRAM according to Embodiment 3.

Referring to FIG. 31, a field oxide film 12 to separate an active region from another active region is formed on the surface of semiconductor substrate 13. A conductive layer 15 of first type conductivity is formed in the main surface of semiconductor substrate 13. If conductive layer 15 of the first type conductivity is formed into an N type layer, arsenic or the like is implanted. If conductive layer 15 of the first type conductivity is formed into a P type layer, boron or the like is implanted.

Figure 32:
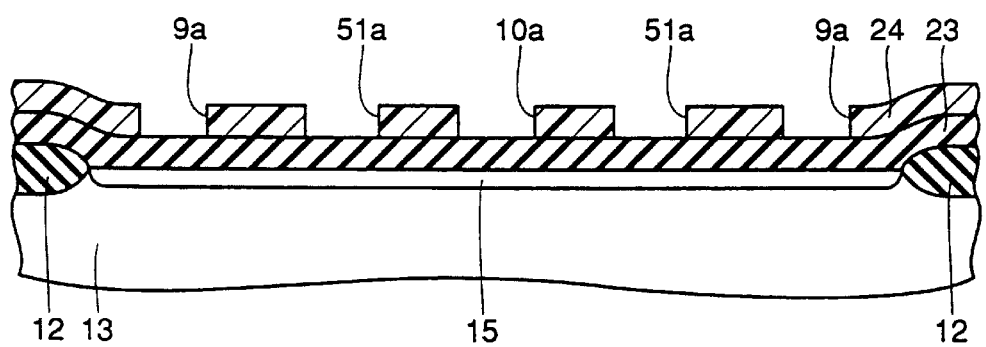

Referring to FIG. 32, interlayer insulating film 23 is formed on semiconductor substrate 13. A resist pattern 24 is formed on interlayer insulating film 23. Resist pattern 24 includes an opening portion 51a to form an interconnection groove, an opening portion 10a to form the first contact hole, and an opening portion 9a to form the second contact hole.

Figure 33:
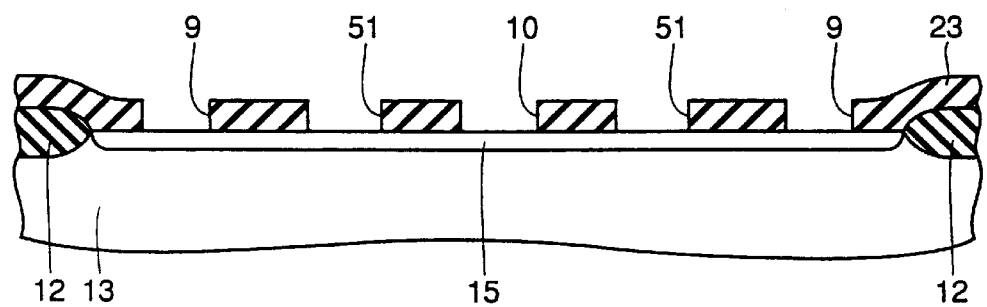

Referring to Figs. 32 and 33, using resist pattern 24 as a mask, interlayer insulating film 23 is patterned by means of dry-etching, and first and second contact holes 10 and 9 and interconnection groove 51 are formed. Since interconnection groove 51 and first and second contact holes 10 and 9 are formed at a time, their positions will not be shifted from each other. In addition, the step of placing a photomask on resist is eliminated, the total precision of registration is further improved as compared to Embodiment 1. As a result, margin in fine processing is further increased.

Figure 34:
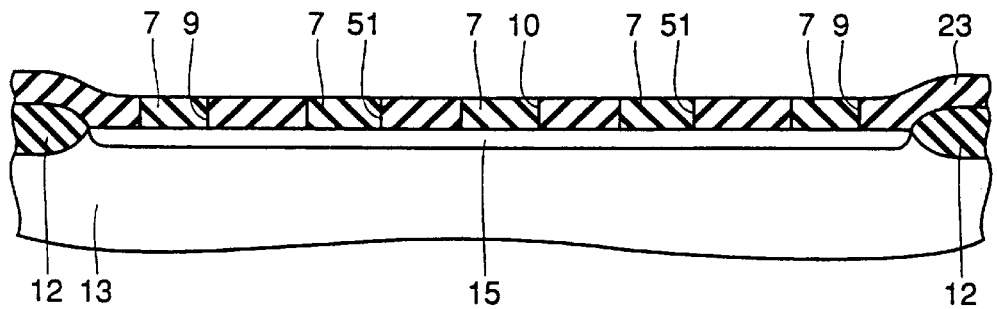

Referring to FIG. 34, groove 51 and first and second contact holes 10 and 9 are filled with an insulating material 7 allowing an etching speed higher than the etching speed of interlayer insulating film 23. As the insulating material, a spin-on-glass film, and a TEOS film formed by means of CVD are preferably used.

Figure 35:
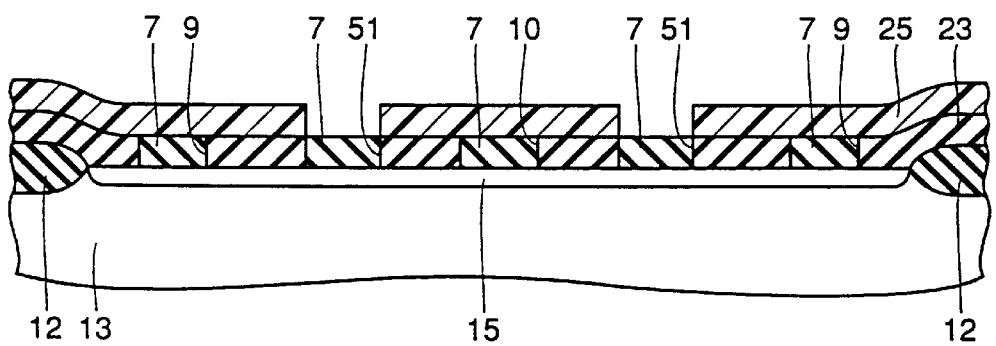

Referring to FIG. 35, a resist pattern 25 having an opening portion on interconnection groove 51 is formed.

Figure 36:
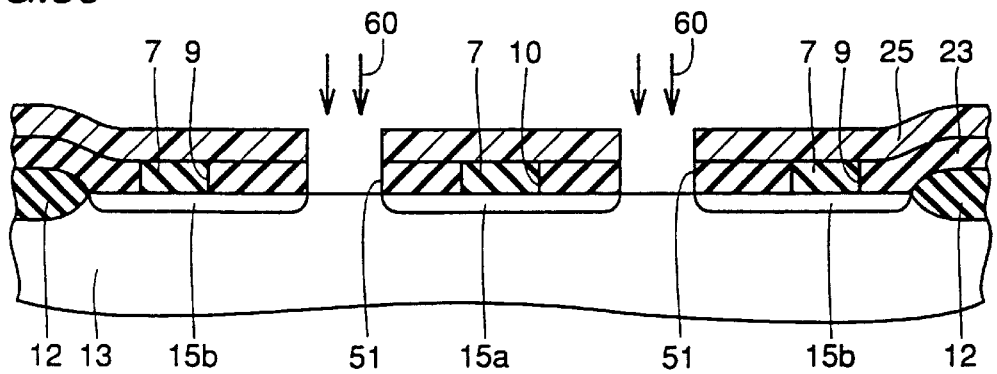

Referring to FIGS. 35 and 36, using resist pattern 25 as a mask, only the insulating material 7 filled within interconnection groove 51 is selectively removed to expose a surface of semiconductor substrate 13. Through interconnection groove 51, impurity ions 60 of second type conductivity are implanted into the exposed surface of the semiconductor substrate, and an impurity layer of the second type conductivity is formed under interconnection groove 51 as a result. The impurity layer of the second type conductivity is formed into the channel region of a transistor. By this implantation of the impurity ions of the second type conductivity, the conductive layers of the first type conductivity remaining on both sides of interconnection groove 51 are separated into a pair of source/drain layers 15a and 15b. Resist pattern 15 is then removed away.

Figure 37:
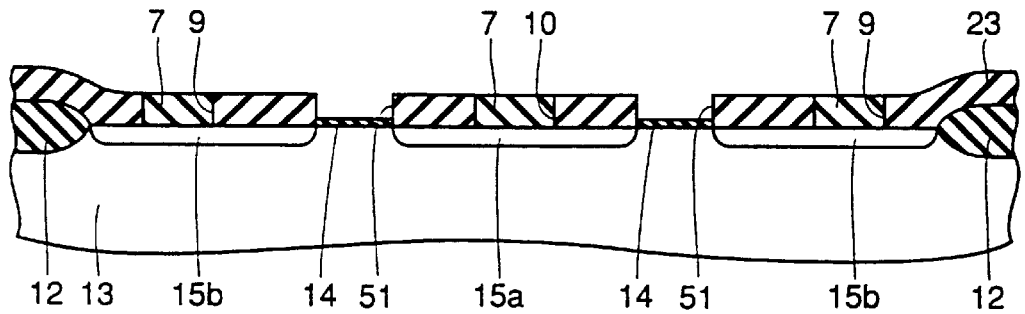

Referring to FIG. 37, a gate oxide film 14 is formed on the bottom of interconnection groove 51.

Figure 38:
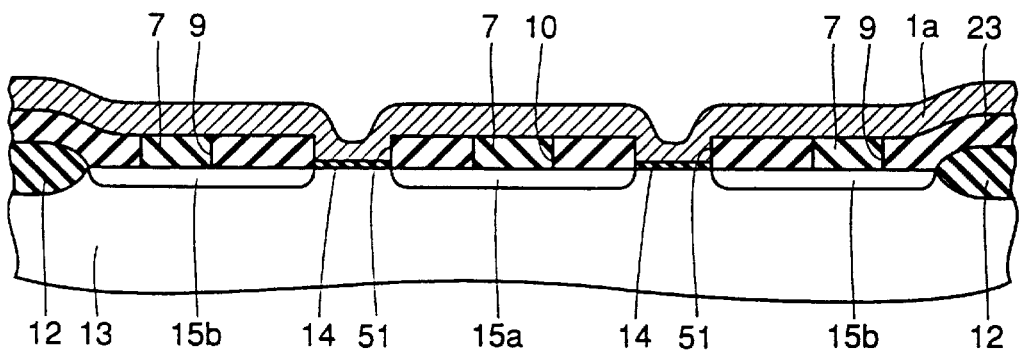

Referring to FIG. 38, a gate interconnection layer precursor 1a connected to the surface of semiconductor substrate 13 through gate oxide film 14 is formed on semiconductor substrate 13.

Figure 39:
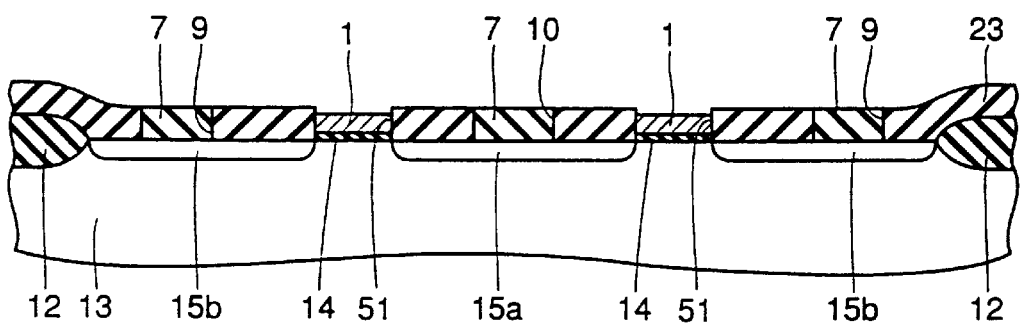

Referring to FIG. 39, gate interconnection precursor 1a is etched back until its surface height is almost the same as the height of the surface of interlayer insulating film 23, and a gate interconnection layer 1 buried within interconnection groove 51 is formed as a result. The surface of gate interconnection layer 1 may be set slightly higher or lower than the surface of interlayer insulating film 23.

Figure 40:
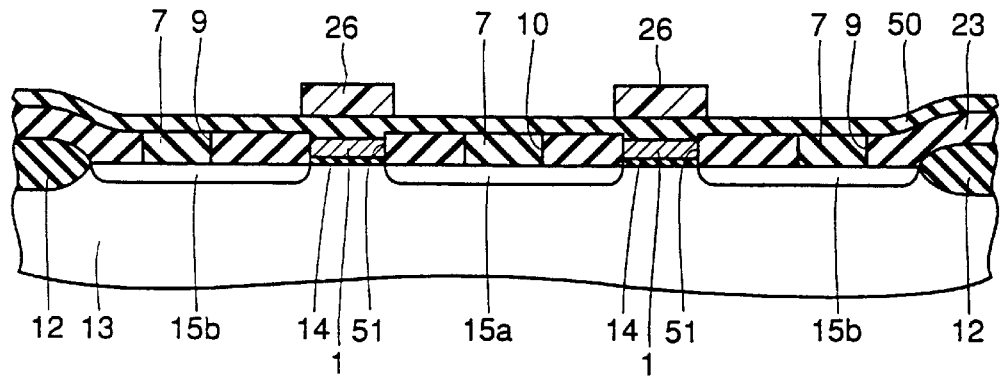
Figure 41:
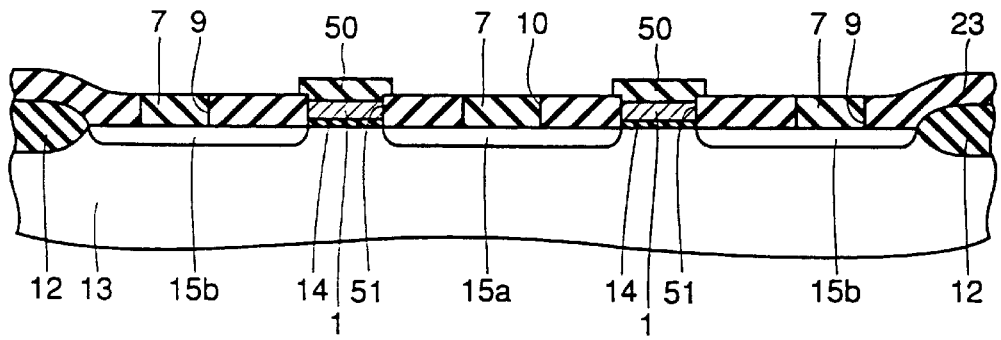

Referring to FIG. 40, first insulating film 50 is formed on semiconductor substrate 13. Referring to FIGS. 40 and 41, first insulating film 50 is selectively etched, using a resist pattern 26 as a mask, and first insulating film 50 covering gate interconnection layer 1 is formed.

Figure 42:
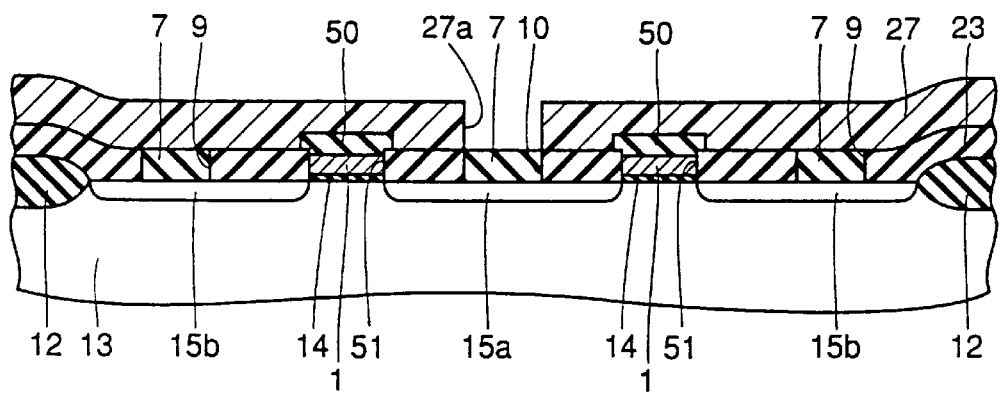

Referring to FIG. 42, a resist pattern 27 having an opening portion 27a on first contact hole 10 is formed on semiconductor substrate 13.

Figure 43:
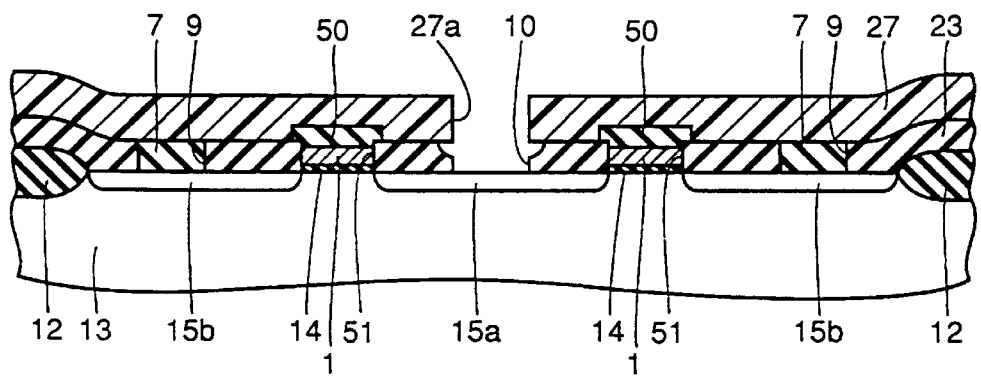

Referring to FIG. 43, using resist pattern 27 as a mask, insulating material 7 within first contact hole 10 is etched away. At the time, the top of first contact hole 10 is tapered. Resist pattern 7 is removed away.

Figure 44:
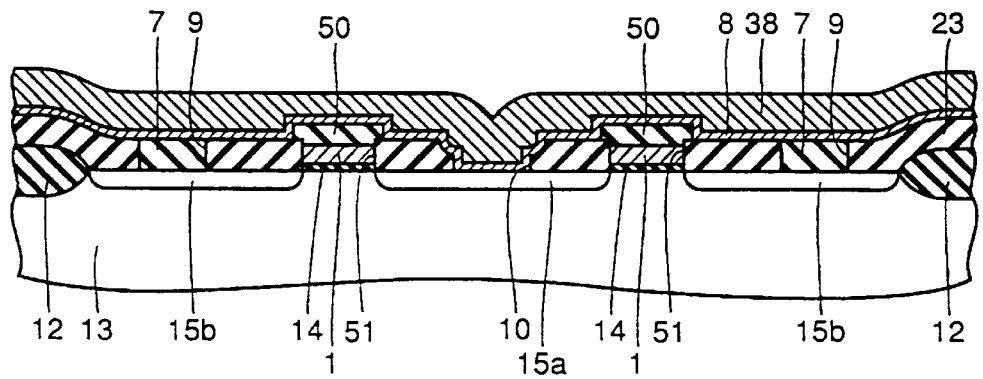

Referring to FIG. 44, TiN is sputtered on interlayer insulating film 23 to cover the sidewall surface and bottom surface of contact hole 10 by means of collimate sputtering, and a TiN film 8 results. Thereafter, a polysilicon film or a tungsten silicide film 38 is formed on TiN film 8 buried within first contact hole 13 by means of CVD.

Figure 45:
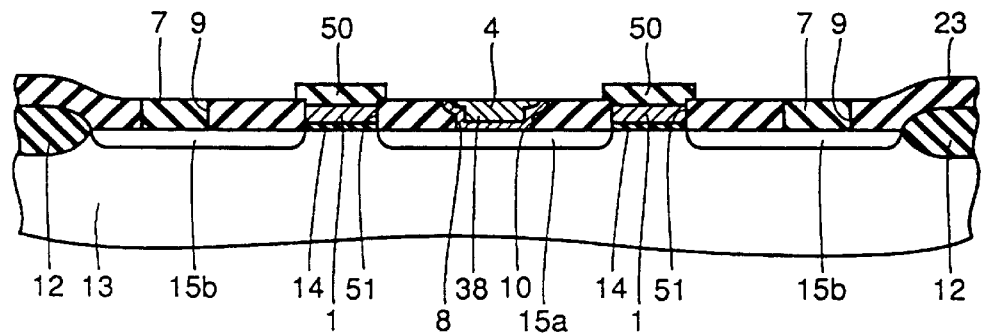

Referring to FIGS. 44 and 45, polysilicon film or tungsten silicide film 38 and TiN film 8 are etched back or polished by means of a chemical/mechanical polishing method. In the condition of polishing by etching back or CMP, the level of the surface of bit interconnection layer 4 is selected to be almost the same as that of the surface of interlayer insulating film 23.

Figure 46:
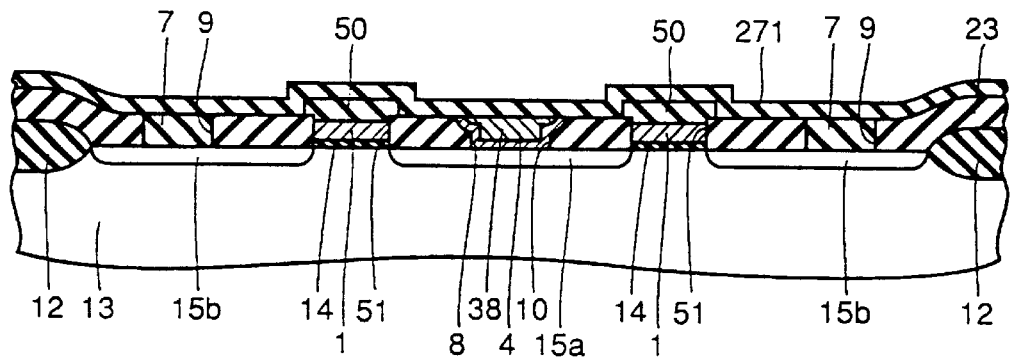

Referring to FIG. 46, a second insulating film 271 is formed on semiconductor substrate 13 in contact with the surface of bit interconnection layer 4.

Figure 47:
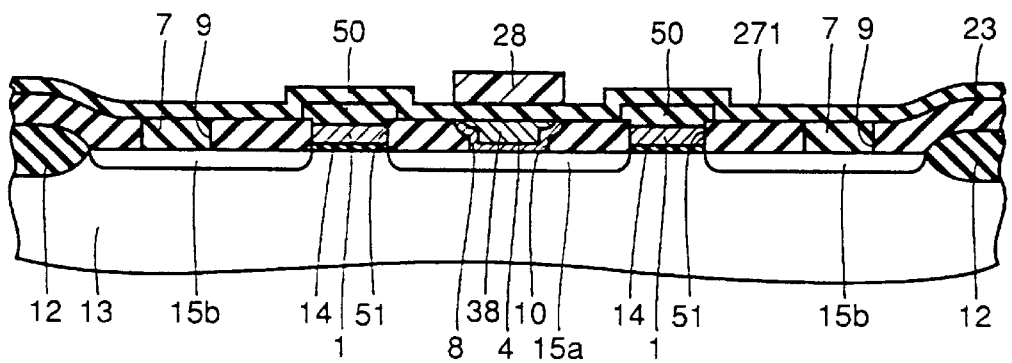
Figure 48:
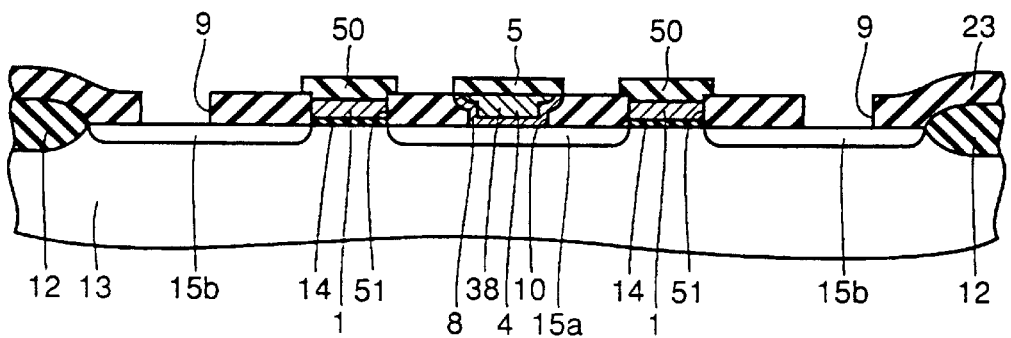

Referring to FIG. 47, resist 28 is formed on second insulating film 271 and only at the upper portion of bit interconnection layer 4. Referring to FIGS. 47 and 48, using resist 28 as a mask, second insulating film 271 is patterned, and insulating film 7 is removed away. Insulating film 7 is etched at a speed higher than that of interlayer insulating film 23, and therefore interlayer insulating film 23 is not etched during the etching. Insulating film 7 is removed to expose a surface of the other 15b of the source/drain regions.

Figure 49:
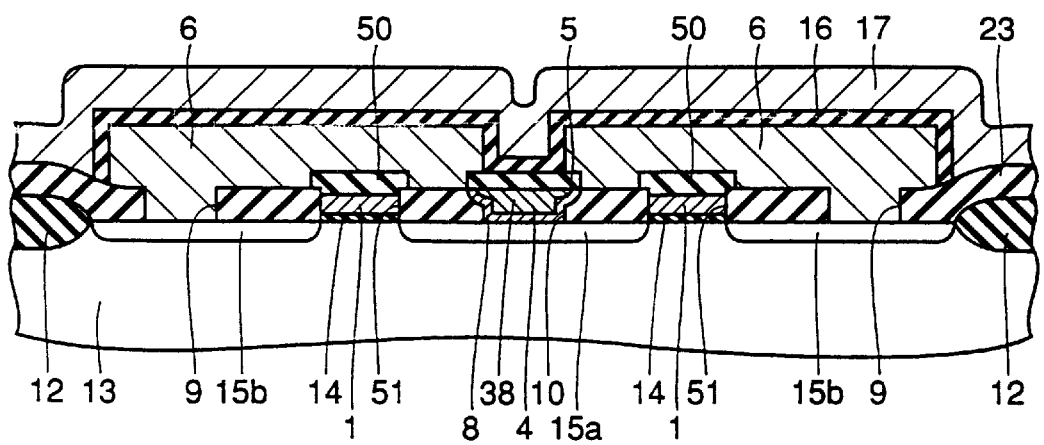

Referring to FIG. 49, a polysilicon film is formed on semiconductor substrate 13 to be filled within second contact hole 9, which is patterned to form a storage node interconnection 6. Thereafter, the surface of storage node interconnection 6 is covered with a capacitor insulating film 16. With capacitor insulating film 16 therebetween, a cell plate electrode 17 is formed to cover storage node interconnection 6 to complete a DRAM according to Embodiment 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate;
   a first conductive layer and a second conductive layer formed apart from each other on a surface of said semiconductor substrate,
   an interlayer insulating film formed on said semiconductor substrate,
   a first contact hole for exposing a surface of said first conductive layer being formed in said interlayer insulating film;
   a first interconnection layer filling said first contact hole so as to be in contact with said first conductive layer, the upper surface of said first interconnection layer being the same as or lower than the surface of said interlayer insulating film;
   an insulating film covering the surface of said first interconnection layer;
   a second contact hole formed in said interlayer insulating film for exposing a surface of said second conductive layer; and
   a second interconnection layer provided on said interlayer insulating film so as to be in contact with said second conductive layer through said second contact hole.

2. A semiconductor device as recited in claim 1, wherein the thickness of said insulating film is at least 0.05 µm.

3. A semiconductor device as recited in claim 1, wherein said semiconductor device includes a bipolar transistor.

4. A semiconductor device, comprising:
   a semiconductor substrate;
   a gate electrode formed on said semiconductor substrate;
   a pair of source/drain layers provided in a surface of said semiconductor substrate on both sides of said gate electrode;
   an interlayer insulating film provided on said semiconductor substrate, covering said gate electrode;
   a first contact hole for exposing a surface of one of said source/drain layers being provided in said interlayer insulating film;
   a buried bit interconnection layer buried in said first contact hole so as to be electrically connected to said one source/drain layer,
   the upper surface of said buried bit interconnection layer is the same as or lower than the position of the surface of said interlayer insulating film;

an insulating film covering the entire upper surface of said buried bit interconnection layer;

a second contact hole provided in said interlayer insulating film for exposing a surface of the other of said source/drain layers;

a storage node interconnection provided on said interlayer insulating film so as to be connected to said the other source/drain layer through said second contact hole;

a capacitor insulating film covering a surface of said storage node interconnection; and a cell plate electrode covering said storage node interconnection with said capacitor insulating film therebetween.

5. A semiconductor device, comprising:

a semiconductor substrate having a main surface;

an interlayer insulating film provided on said semiconductor substrate;

an interconnection groove provided in said interlayer insulating film for burying a gate interconnection layer;

a pair of source/drain layers provided in the main surface of said semiconductor substrate and on both sides of said interconnection groove;

a first contact hole to expose one of said source/drain layers and a second contact hole to expose the other of said source/drain layers, said first and second contact holes being provided in said interlayer insulating film;

a gate interconnection layer filling said interconnection groove and having an upper end level almost as high as the upper end level of said interlayer insulating film;

a bit interconnection layer filling said first contact hole and having an upper end level almost as high as the upper end level of said interlayer insulating film;

a first insulating film covering said gate interconnection layer;

a second insulating film covering said bit interconnection layer;

a storage node interconnection provided on said interlayer insulating film to be connected to the other of said source/drain layers through said second contact hole;

a capacitor insulating film covering the surface of said storage node interconnection; and a cell plate electrode to cover said storage node interconnection with said capacitor insulating film therebetween.

6. The semiconductor device as recited in claim 5, wherein the thickness of each of said first and second insulating film is at least 0.05 $\mu$m.

* * * * *